United States Patent
Nomura et al.

(10) Patent No.: US 6,343,242 B1
(45) Date of Patent: Jan. 29, 2002

(54) PROTECTIVE DEVICE FOR CLEAN ROBOT

(75) Inventors: Akihiro Nomura; Shinji Yamashita; Masafumi Tamai; Satoshi Murakami; Shinobu Satou; Takeo Suzuki, all of Kitakyushu (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 0 days.

(21) Appl. No.: 09/807,418

(22) PCT Filed: Jul. 15, 1999

(86) PCT No.: PCT/JP99/03814

§ 371 Date: Jun. 11, 2001

§ 102(e) Date: Jun. 11, 2001

(87) PCT Pub. No.: WO00/24053

PCT Pub. Date: Apr. 27, 2000

(30) Foreign Application Priority Data

Oct. 19, 1998 (JP) .......................................... 10-296549

(51) Int. Cl.[7] ............................................. G06F 19/00
(52) U.S. Cl. ........................... 700/245; 700/260; 901/9; 901/34; 901/47; 370/508; 370/516; 370/517; 318/568.11
(58) Field of Search ................................. 700/245, 260; 375/254; 901/9, 34, 45, 47, 50; 370/508, 516, 517; 318/568.11

(56) References Cited

U.S. PATENT DOCUMENTS

| 4,791,588 A | * 12/1988 | Onda et al. ............... 700/260 |
| 4,962,338 A | * 10/1990 | Daggett et al. ......... 318/568.11 |
| 5,432,352 A | * 7/1995 | Van Bavel .............. 250/492.21 |
| 6,038,259 A | * 3/2000 | Nanya ..................... 375/254 |

FOREIGN PATENT DOCUMENTS

| JP | 55-95110 | 7/1980 |
| JP | 2-94540 | 4/1990 |
| JP | 4-146847 | 5/1992 |
| JP | 5-304198 | 11/1993 |
| JP | 8-201419 | 8/1996 |
| JP | 8-320334 | 12/1996 |
| JP | 10-30978 | 2/1998 |

* cited by examiner

Primary Examiner—William A. Cuchlinski, Jr.
Assistant Examiner—McDieunel Marc
(74) Attorney, Agent, or Firm—Armstrong, Westerman, Hattori, McLeland & Naughton, LLP

(57) ABSTRACT

The invention relates to a protective device for a clean robot that includes a base 7 in which actuators 4 and 5 for driving a robot arm 3 are accommodated; a translational guide 8 for causing the base 7 to travel in a rectilinear direction; and a robot controller 10 that drives and controls the drive motor 4A and 5A of the robot arm 3 and an actuator 9 of the translational guide 8; wherein the protective device further includes acceleration sensors 11, which are disposed in the base 7 and are provided in respective axes so that they can detect an impact, when the clean robot 1 interferes with a surrounding substance, as vibration acceleration in the three-dimensional directions; an interference detecting device 13 that outputs a pulse when the detection signals of the acceleration sensors 11 of the respective axes exceed the threshold values that will become standards; and the first AND circuit that converts signals outputted from the interference detection means of the respective axes to interference signals, and the drive motors 4A and 5A for the robot arm 3 and the actuator for driving the translation guide 8 are stopped; whereby it is possible to prevent an internally incorporated speed reducer in the robot from being damaged.

3 Claims, 6 Drawing Sheets

PROTECTIVE DEVICE FOR CLEAN ROBOT

TECHNICAL FIELD

The present invention relates to a protective device for a clean robot, which is capable of immediately stopping the robot without a speed reducer of the robot being damaged due to overload in a case where a part of the robot or an object being conveyed by the robot interferes with a surrounding substance.

PRIOR ARTS

Conventionally, a clean robot has been known, which is used as a conveyor apparatus of wafer and liquid crystal substrates in the processes of production and inspection of semiconductors and liquid crystal display panels. Such a clean robot is composed as shown in FIG. 9.

In the drawing, 1 denotes a clean robot in charge of handling work in clean surroundings, 2 denotes a fork that receives and transfers an objected to be transferred such as wafer, etc., 3 denotes a robot arm that is rotatable around the rotating axis secured in the clean robot 1, 3A denotes the first robot arm having the fork 2 attached at the tip end thereof, 3B denotes the second robot arm attached to the base end part of the first robot arm 3A, 4 and 5 denote actuators that drive the robot arms 3, 4A denotes the first drive motor, 4B denotes the first speed reducer coupled to the first drive motor 4A, 5A denotes the second drive motor, and 5B denotes the second speed reducer coupled to the second drive motor 5A. 6 denotes a drive drum that rotates the robot arms 3 via the actuators 4 and 5, and 7 denotes a base in which the actuators 4 and 5, and the drive drum 6 are accommodated. 8 denotes a translational guide that causes the base 7 to travel in the rectilinear direction, 9 denotes an actuator of the translational guide 8, and 10 denotes a robot controller that issues instructions to drive and control the actuators 4, 5 and 9.

In the clean robot 1 thus constructed, drive instructions are given from the robot controller 10 to the actuators 4, 5 and 9, wherein the robot arms 3 are caused to turn, extend and contract, and at the same time a wafer is transferred and received by the fork 2 attached to the tip end of the first robot arm 3A by combinations of travelling motions by the translational guide 8.

However, in prior arts, there are cases where an operator makes a mistake in the teaching operations of the robot, and the fork, robot arms of the clean robot, and/or an object to be transferred such as wafer, etc., interfere with substances such as a semiconductor production device, inspection device, etc., which are installed in the surroundings thereof. At this time, since the drive motor that drives the robot arms attempts to further actuate the robot arms even if the clean robot interferes with the surrounding substances, the speed reducer, which is provided between the drive motor and the robot arms, is overloaded, and in the worst case, the speed reducer may be damaged.

It is therefore an object of the invention to provide a protective device for a clean robot that is capable of safely stopping the operations of the clean robot when a part of the clean robot or an object to be transferred by the robot interferes any surrounding substance, and preventing in advance the speed reducer from being damaged.

DISCLOSURE OF THE INVENTION

The present invention provides a clean robot that comprises robot arms that are capable of holding a fork for receiving and transferring a substance such as wafer at the tip ends thereof, and turning, extending and contracting in the horizontal direction; a base that is disposed at the lower part of the abovementioned robot arm and internally accommodates an actuator consisting of a drive motor for driving the abovementioned robot arm and a speed reducer coupled to the abovementioned drive motor; a translational guide provided so that it can rectilinearly move the abovementioned base in the horizontal direction; and a robot controller for driving and controlling the abovementioned robot arms and translational guide; and further includes a signal processing circuit that comprises acceleration sensors that are disposed inside the abovementioned base and provided in respective axes so that they can detect an impact, which is given by interference of the abovementioned clean robot with any surrounding substance, as a vibration acceleration in three-axis directions orthogonal to each other; interference detection means that are provided in contact with the acceleration sensors of the respective axes and outputs a pulse signal when the detection signal of the abovementioned acceleration sensors exceeds a certain threshold value; a first AND circuit for converting the signals, which are outputted from the interference detection means of the respective axes, to interference signals; wherein after the interference signals outputted from the abovementioned signal processing circuit are transmitted to the abovementioned robot controller, the drive motor of the abovementioned actuator is stopped.

Also, the abovementioned interference detection means is composed of a buffer amplifier converting acceleration signals from the abovementioned acceleration sensor with respect to impedance; a band-pass filter for discriminating the frequency band of output signals of the vibration acceleration that is impedance-converted by the buffer amplifier; an amplifier for amplifying the output signals of the abovementioned band-pass filter; the first and second-comparators for comparing the output signals of the vibration acceleration, which are amplified by the abovementioned amplifier, with the upper limit signal and lower limit signal of the vibration acceleration, which become the abovementioned threshold values; and the second AND circuit for converting the signals compared by the abovementioned two comparators to signals, which output interference when the signals exceed any one of the threshold values.

Further, the invention is featured in that a latch circuit, which holds a pulse signal from the abovementioned interference detection means for longer than the sampling time of the abovementioned robot controller, between the abovementioned first AND circuit and the abovementioned robot controller, and all the interference detecting signals can be detected by the abovementioned robot controller.

By the abovementioned means, the acceleration sensor secured in the base of the clean robot can detect, as vibration acceleration in the three-dimensional directions, an impact received when the robot is brought into collision with or interferes with a surrounding substance, and the interference detection means, which is connected to the acceleration sensor of the respective axes, outputs a pulse signal when the detection signal of the sensor exceeds the reference threshold values and the first AND circuit converts the signal, which is outputted from the interference detection means of the respective axes, to an interference signal. Therefore, after the interference-detecting signal is sent to the robot controller, it is possible to immediately stop the drive motors of actuators for the robot arms and translational guide.

BEST MODE FOR CARRYING OUT THE INVENTION

Hereinafter, a detailed description is given of embodiments of the invention with reference to the accompanying drawings.

Figure 1A:
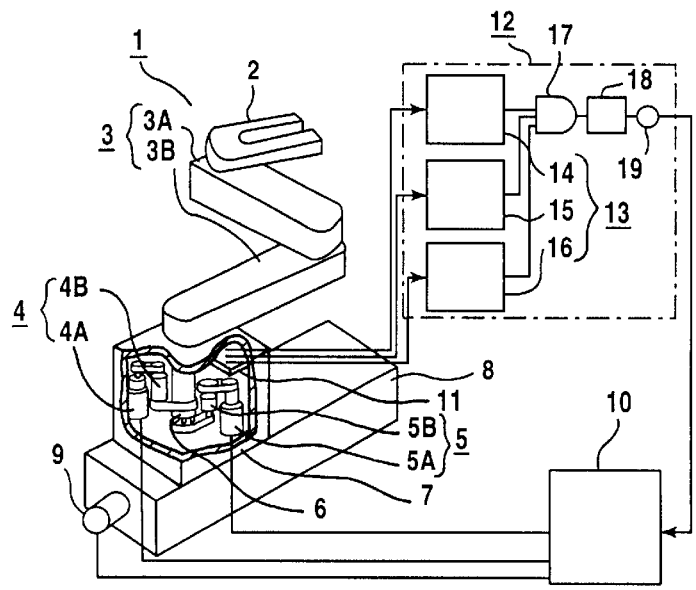
FIG. 1 shows a clean robot equipped with a protective device according to one embodiment of the invention, wherein (a) is a block diagram of the protective device, and (b) is a block diagram showing an X-axis interference detection means of the protective device.

FIG. 1 shows a clean robot equipped with a protective device according to one embodiment of the invention, wherein (a) is a block diagram of the protective device, and (b) is a block diagram showing an X-axis interference detection means of the protective device;

In the drawing, parts that are identical to those of a prior art clean robot are given the same reference number, and overlapping description is omitted. Parts that differ from those of the prior art robot will be described below.

The construction of the invention, which is different from that of the prior art, is as follows;

An acceleration sensor 11 is devised so that it can detect an impact, received when the clean robot 1 interferes with other substances, as vibration acceleration in the three-dimensional directions of X-axis, Y axis and Z axis orthogonal to each other, wherein acceleration sensors for respective axes are fixed on the same sensor substrate. A signal processing circuit 12 is connected to the acceleration sensor 11, and simultaneously processes an interference signal on the basis of the output signal of the acceleration sensors 11. An interference detection means 13 is secured in the signal processing circuit 12. An X-axis interference detection means 14 detects an impact added in parallel to the floor plane (not shown) on which the translational guide 8 is installed, and to the travelling direction (X-axis) of the base 7 of the clean robot 1. A Y-axis interference detection means 15 detects an impact in the direction (Y axis) parallel to the floor plane (not shown) and orthogonal to the travelling direction of the base 7. A Z-axis interference detection means 16 detects an impact in the direction (z axis) orthogonal to the X-axis and Y axis.

Also, the first AND circuit 17 converts one of output signals obtained from the interference detection means of the respective axes to an interference signal when the output signal is low-leveled. A latch circuit 18 holds the interference signal of the first AND circuit 17 for longer than the sampling time of the robot controller 10 and is constructed so that all the interference signals 19 can be detected by the robot controller 10. The interference detecting signals 19 outputted from the latch circuit 18 are sent to the robot controller 10, and the robot controller 10 is devised so as to generate an instruction to stop the first and second drive motors 4A and 5A and the drive motor of the actuator 9.

Next, a description is given of the X-axis interference detection means of the interference detection means of the respective sensors shown above.

A buffer amplifier 20 converts an acceleration signal from the X-axis acceleration sensor 11A in terms of impedance. A band-pass filter 21 is composed of a combination of a high-pass filter 22 and a low-pass filter 23, which are provided to discriminate the frequency band of output signals of vibration acceleration impedance-converted by the buffer amplifier 20. An amplifier 24 amplifies an output signal $S_f$ of the band-pass filter 21. A reference signal source 25 shows the upper limit value of vibration acceleration that will become a standard, a reference signal source 26 shows the lower limit value of vibration acceleration that will become a standard. The first comparator 27 compares the output signal $S_a$ of vibration acceleration, which is amplified by the amplifier 24, with a signal $S_{b1}$ of the reference signal source 25, and outputs a LOW-leveled signal instructing interference when the signal $S_a$ is larger than $S_{b1}$. The second comparator 28 compares the output signal $S_a$ of vibration acceleration, which is amplified by the amplifier 24 as in the above, with a signal $S_{b2}$ of the reference signal source 26, and outputs a LOW-leveled signal instructing interference when the signal $S_a$ is smaller than $S_{b2}$. The second AND circuit 29 converts the interference signal to a signal showing whether or not interference exists, when at least anyone of the signals SC1 and SC2 that are obtained from the first comparator 27 and the second comparator 28 is LOW-leveled. Herein, a description was given of the X-axis interference detection means. However, since the Y-axis and Z-axis interference detection means have the same construction as that of the above means, the description is omitted.

Next, a description is given of the construction of an acceleration sensor.

Figure 2A:
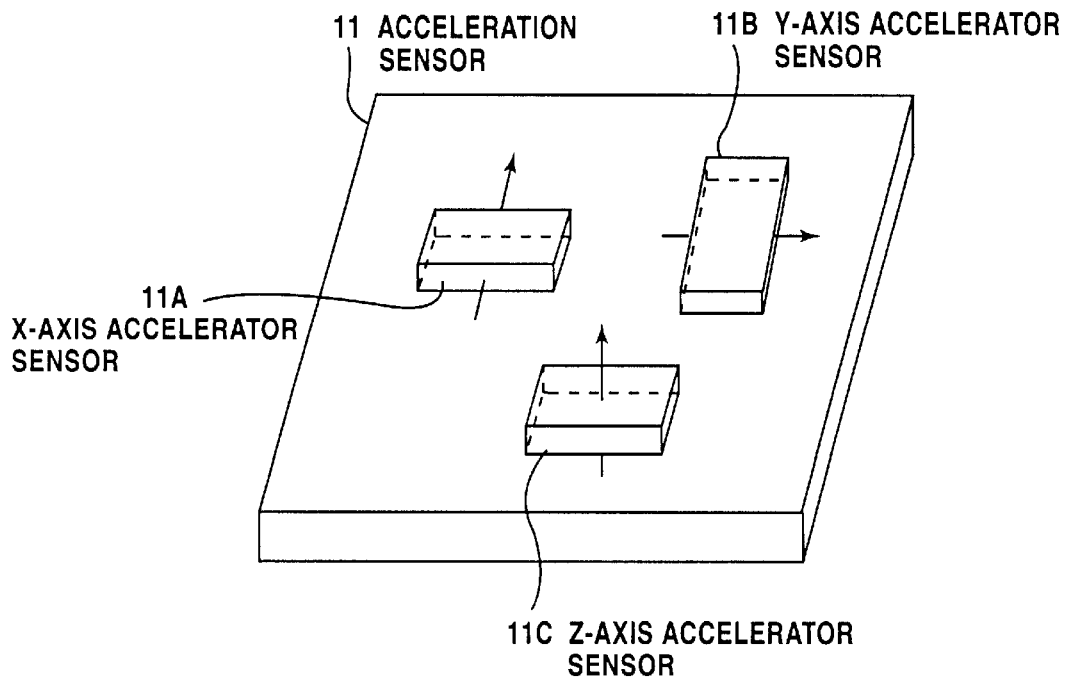
FIG. 2 shows an acceleration sensor used for the embodiment, wherein (a) is a perspective view of an acceleration sensor of respective axes, in which a sensor substrate is incorporated, and (b) is a cross-sectional view showing the structure of the acceleration sensor.
Figure 2B:
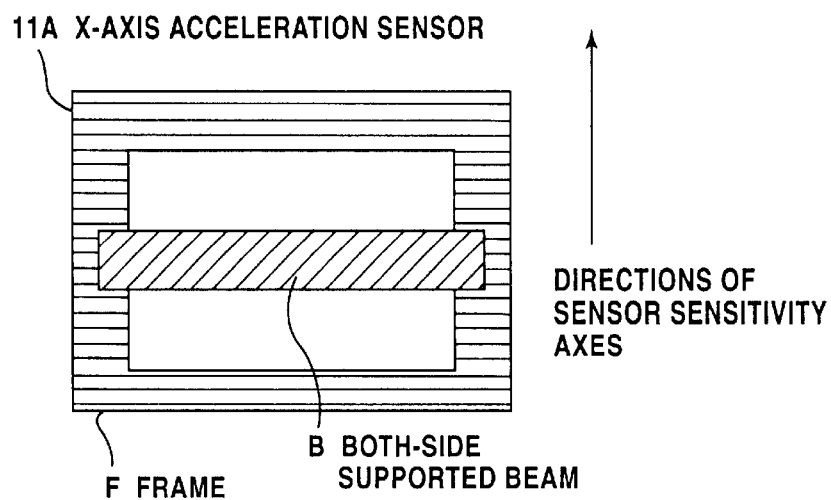

FIG. 2 shows an acceleration sensor used in the embodiment, wherein (a) is a perspective view of acceleration sensors of the respective axes, which are incorporated on the sensor substrate, and (b) is a cross-sectional view showing the construction of the acceleration sensor.

In the drawing, 11A, 11B and 11C, respectively, denote an X-axis accelerator sensor, a Y-axis acceleration sensor, and a Z-axis acceleration sensor, wherein the arrows indicate the directions of sensor sensitivity axes. The acceleration sensor is composed of a frame A and a both-side supported beam B. The both-side supported beam B is composed of a bimorph plate that is constructed by adhering two sheets of piezoelectric ceramic plate having electrodes on the surfaces thereof to each other, and both the ends of the both-side supported beam B are supported by the frame F. In the acceleration sensor thus constructed, if a vertical force is applied to the both-side supported beam B and the beam B is subjected to strain after having been deformed, the piezoelectric ceramic is polarized to cause electric charge to be generated on the two sheets of electrodes, and a voltage corresponding to the electrostatic capacity is generated on the sensor. Herein, the sensor output voltage is subjected to influences of sensor insulation resistance and input resistance of the signal processing circuit, and voltage transmitted to the signal processing circuit has frequency characteristics. The acceleration sensor is devised so that, since the generation voltage is proportional to the intensity of vibration in a higher frequency area than the cut-off frequency, the generation voltage of the sensor is sent to the signal processing circuit connected to the sensor if vibration is given thereto, and judgment is made as to the detection of interference.

Figure 3:
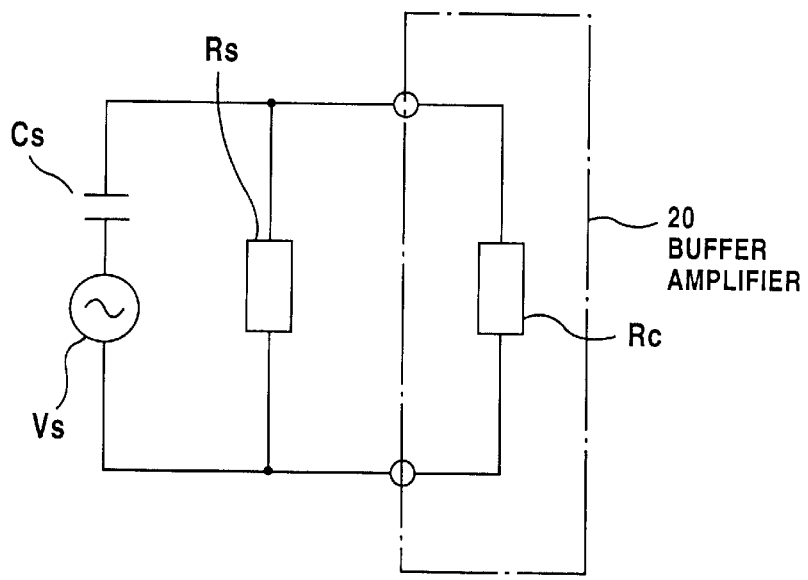
FIG. 3 shows an electrically equivalent circuit of the acceleration sensor.

FIG. 3 shows an electrically equivalent circuit of the acceleration sensor.

In the drawing, Cs denotes electrostatic capacity of the sensor, Rs denotes insulation resistance of the sensor, Rc is input resistance of the processing circuit, and Vs is an output voltage of the sensor. The acceleration sensor and its processing circuit can be approximated to a primary high-pass filter by means of the electrostatic capacity Cs of the acceleration sensor, insulation resistance Rs and input resistance Rc of the sensor signal processing circuit, and the cut-off frequency Fc can be expressed by the following expression $$Fc=(Rs+Rc)/(2*\pi*Cs*Rs*Rc)$$

Figure 1B:
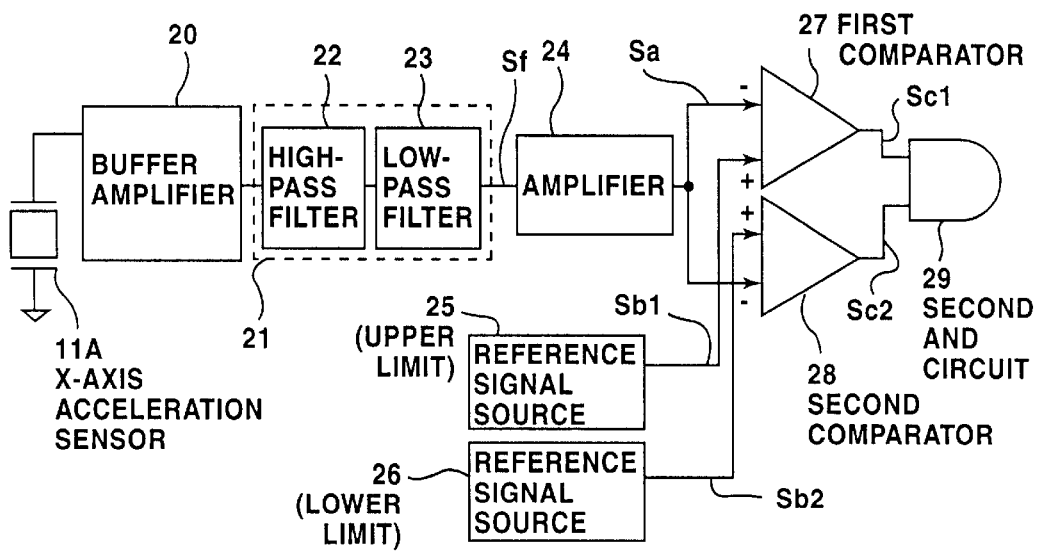

In the case of the acceleration sensor used for the invention, since the electrostatic capacity Cs=420 pF and the insulation resistance Rs=500 MΩ, the cut-off frequency Fc of the high-pass filter 380 Hz when the input resistance Rc of the signal processing circuit is 1 MΩ, 38.7 Hz when the input resistance Rc thereof is 10 MΩ, and 8.3 Hz when the input resistance there is 50 MΩ. Thus, in order to process an acceleration sensor signal from a low frequency band in the vicinity of 10Hz, the input resistance Rc of the processing circuit must be set to 50 MΩ or more. Therefore, the signal of the acceleration sensor 11, which is shown in FIG. 1(b), is converted by the buffer amplifier 20 having input resistance of 50 MΩ in terms of impedance.

Next, a description is given of the motion.

If the clean robot 1 that holds a silicon wafer, glass substrate, etc., interferes with a wafer cassette or other substance existing around the robot 1, an impact reversed from the substance is further transmitted to the actuators 4 and 5 secured in the base 7 after it has been transmitted from the fork 2 of the robot to the robot arm 3. At that time, since the attaching substrate of the accelerator sensor 11, which is provided in the vicinity of the actuators 4 and 5 in the base 7, vibrates, the vibrations of the substrate is detected by the acceleration sensor 11.

A description will be given of the X-axis in order to simplify the description of the interference detection means 13. First, the vibration acceleration detected by the acceleration sensor 11A is amplified by an amplifier 24 via the band pass filter 21. Continuously, in the first comparator 27 and the second comparator 28, the amplification signal $S_a$ amplified by the amplifier 24 is compared with the signal $S_{b1}$ of the reference signal source 25, which will become the upper limit value, and the signal $S_{b2}$ of the reference signal source, which will become the lower limit value. If the amplification signal $S_a$ is larger than the reference signal $S_{b1}$ that becomes the upper limit value or smaller than the reference signal $S_{b2}$ that becomes the lower limit value, a LOW-leveled signal is issued to inform that interference has been detected. Next, where anyone of the signals outputted from the first comparator 27 and the second comparator 28 is LOW-leveled, the signal enters the second AND circuit to inform that the acceleration sensor 11A has detected the interference, wherein an interference detecting signal as to whether or not interference exists is issued. Herein, since the Y-axis and Z-axis interference detection means operate as in the signal process for the X-axis, the description thereof is omitted.

Subsequently, as interference signals are obtained by the Y-axis and Z-axis interference detection means 15 and 16 as in the X-axis interference detection means 14 described above, the interference detecting signals enter the first AND circuit 17, wherein if any one of the interference detecting signals is LOW-leveled, the final interference detecting signal 19 is outputted. Herein, the output of the first AND circuit 17 is retained by the latch circuit 18.

Herein, the output waveform of the first AND circuit 17 becomes a pulse having a wide time width where an impact transmitted by the interference is large while it becomes a pulse having a narrow time width where the impact is small. There is a possibility that no pulse having a narrow time width can be detected, depending on the sampling time of the robot controller 10. For example, in the case where the sampling time is 2 ms, a case arises where no pulse of 2ms or less can be detected. Therefore, in order to hold the output signal of the first AND circuit by the latch circuit for longer than the sampling time and to detect all the interference detecting signals by the robot controller 10, the clean robot 1 will finally stop upon receiving the interference detecting signals 19 by the robot controller 10.

Figure 4:
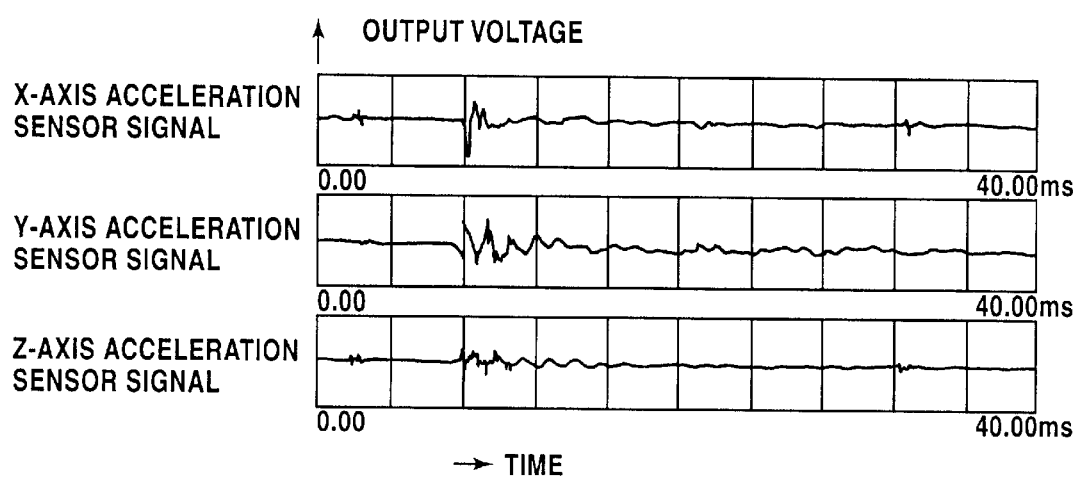
FIG. 4 shows output waveforms of the acceleration sensor of the respective axes when a clean robot makes interference during the extending and contracting motion.
Figure 5:
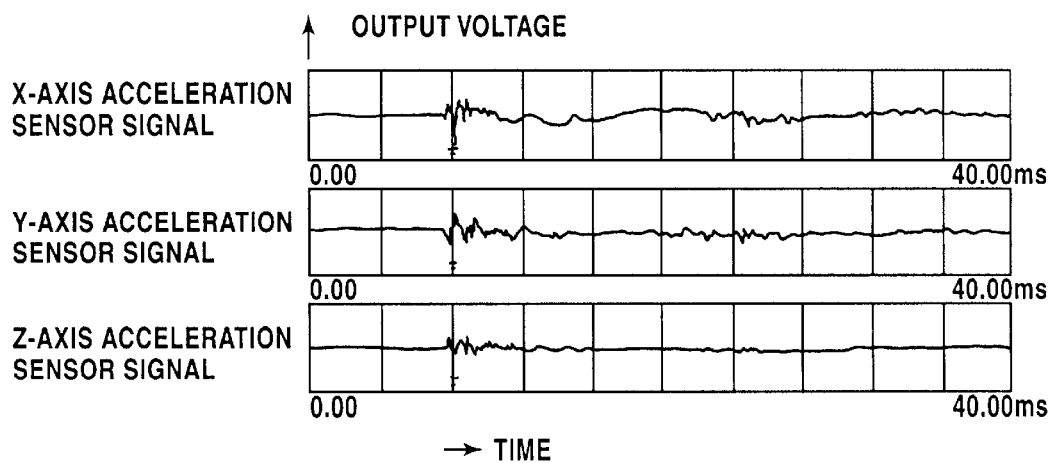
FIG. 5 shows output waveforms of the acceleration sensor of the respective axes when a clean robot makes interference during the turning motion.
Figure 6:
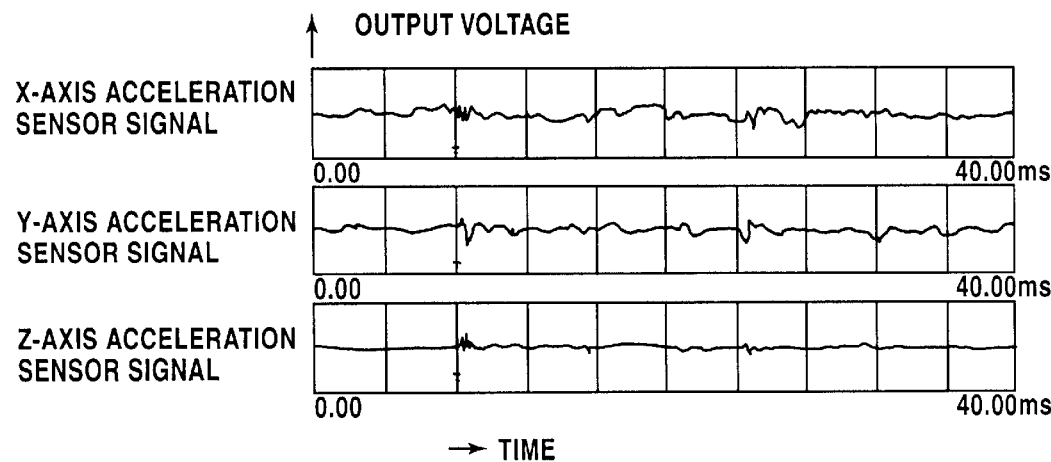
FIG. 6 shows output waveforms of the acceleration sensor of the respective axes when a clean robot makes interference during the travelling motion.

Next, FIG. 4 through FIG. 6 describe examples of the output waveforms of the acceleration sensor signals of the respective axes due to interference of the clean robot.

FIG. 4 shows output waveforms of the acceleration sensor of the respective axes when a clean robot makes interference during the extending and contracting motion. FIG. 5 shows output waveforms of the acceleration sensor of the respective axes when a clean robot makes interference during the turning motion. FIG. 6 shows output waveforms of the acceleration sensor of the respective axes when a clean robot makes interference during the travelling motion;

As shown in FIG. 4, where the clean robot make interference during the extending and contracting motion, the signal of the Y-axis acceleration sensor becomes the largest. Also, where interference is caused during the turning motion, the signal of the X-axis acceleration sensor becomes the largest based on FIG. 5. Further, as shown in FIG. 6, where interference is caused during the travelling motion, it is found that, as to the signal due to the interference, the signals of the X-axis acceleration sensor and Y-axis acceleration sensor become larger than that of the Z-axis acceleration sensor signal. However, a background signal appears in the signals of the X-axis acceleration sensor and Y-axis acceleration sensor during the travelling motion. On the other hand, no large background signal appears in the signal of the Z-axis acceleration sensor. A signal appears in only a case where interference occurs.

Based on the abovementioned result, such effects can be brought about, by which judgment is made as to interference by the Y-axis acceleration sensor where extending and contraction motions are carried out, and judgment is made as to interference by the X-axis acceleration sensor where a turning motion is carried out. Further, an effect can be brought about, by which judgment is made as to interference by the Z-axis acceleration sensor where the interference occurs during the travelling motion.

Therefore, in the clean robot, an acceleration sensor that detects an impact, which occurs when the robot interferes with a surrounding substance, as vibration acceleration in the three-dimensional directions is provided in the base, and an interference detection means that outputs a pulse signal where the detection signal of the acceleration sensors of the respective axes exceeds the threshold values that will become standards is provided therein. Further, since the first AND circuit that converts the signals outputted from the interference detection means of the respective axes to interference signals, it is possible to safely stop the actuators for drive motors of the robot arms and translational guide, and it is possible to prevent, in advance, the speed reducer from being damaged often transmitting the interference detecting signal to the robot controller.

Also, the acceleration sensor does not need to detect an impact in all the three-dimensional directions where the motion of the clean robot and conditions of interference are limited. The acceleration sensor may be of such a type that can detect an impact in only one or two axial directions for which the interference detection sensitivity is high.

Also, although an acceleration sensor in which piezoelectric ceramics are used is employed in the embodiment, there is no problem if other types of sensor may be employed.

In addition, the acceleration sensors are installed in the base of the robot in the embodiment. However, the acceleration sensors may be installed inside the fork or inside the robot arm.

Further, in the embodiment, if the sampling speed of the robot controller is sufficiently fast, no latch circuit may be employed.

Still further, the band-pass filter is set to determine the cutoff frequency of the high-pass filter and low-pass filter so that the intensity of the signal when interference occurs is maximized with respect to the signal when the clean robot normally operates. In the embodiment, the cut-off frequency of the high-pass filter is set to 400 Hz, and that of the low-pass filter is set to 1.5 kHz. The cut-off frequencies may be adequately established because they become different figures in compliance with the type of a robot, substance to be transferred, and/or surrounding substance with which interference occurs.

In addition, an OR circuit may be employed instead of the AND circuit secured in the signal processing circuit. At this time, the symbols (plus and minus) of the input terminals of the first and second comparators are inverted.

Next, a description is given of another embodiment of the invention.

Figure 7:
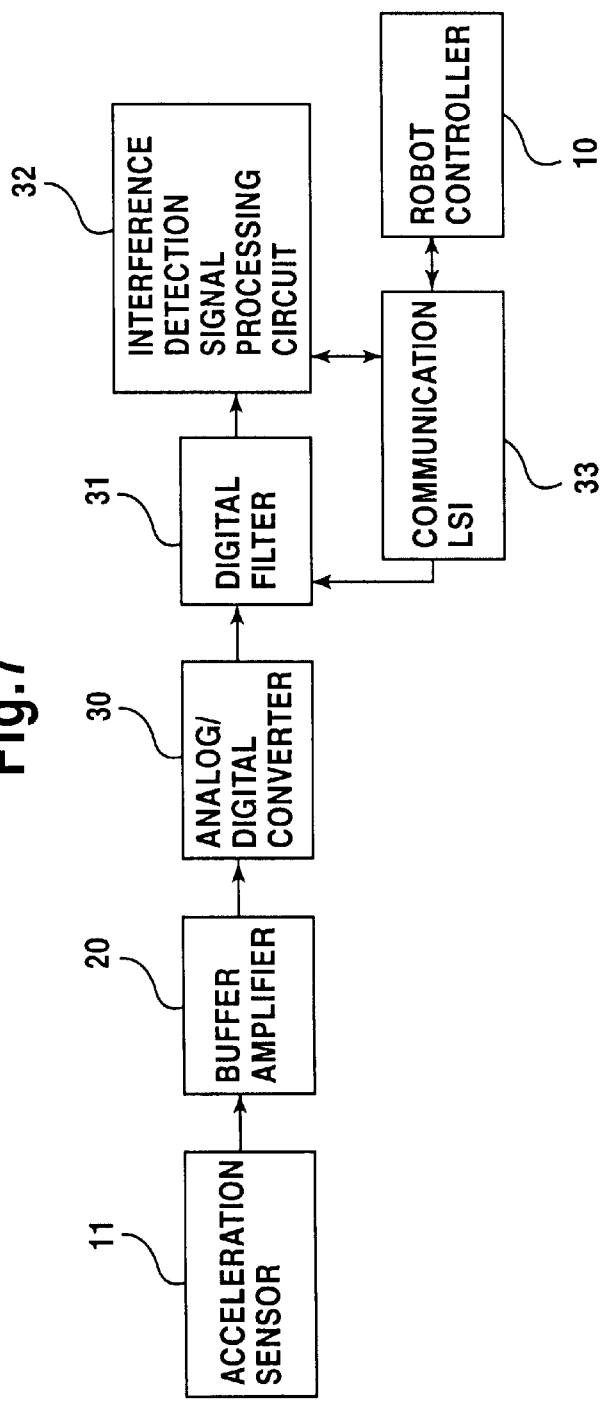
FIG. 7 is a block diagram showing an interference detection means according to another embodiment of the invention.

The invention maybe constructed, instead of the embodiment shown in FIG. 1, so that a communication feature is added to the acceleration sensors to enable a communication with the robot controller by digitally processing the interference detection signals, wherein the system parameters of transmission of interference detection signals and of interference detection means may be altered. Hereinafter, a description is given of another embodiment with reference to FIG. 7.

That is, in the drawing, 30 denotes an analog/digital converter, which converts analog signals outputted from the acceleration sensor to digital signals. 31 denotes a digital filter that is employed instead of a band-pass filter shown in FIG. 1. The digital filter 31 picks up only specified frequency components of the digital signals converted by the A/D converter 30. The coefficient of the filter is stored in a rewritable memory element RAM. Also, 32 denotes an interference detection signal processing circuit, which is equivalent to an integrated circuit in which an amplifier 24, reference signal sources 25 and 26, the first and second comparators 27 and 28, and the second AND circuit 29, shown in FIG. 1, are integrated.

The interference detection signal processing circuit 32 always monitors the output signals of the digital filter 31, and outputs an interference generation signal by judging, when the size of the absolute value of the output signal exceeds the threshold value of interference, that interference has occurred. It is possible to set the sensitivity of the interference detection to an optional level by changing the threshold value to a specified value. Also, 33 denotes a communication LSI, which monitors an interference generation signal of the interference detection signal processing circuit 32, and transmits the information to the robot controller 10 via a communication cable where interference occurs.

In addition, the communication LSI 33 receives parameter values such as a coefficient of the digital filter 31 and threshold values of the interference detection signal processing circuit 32, which have been transmitted from the robot controller 10, and rewrites the values of a memory element (not shown), in which the coefficients of the digital filter 31 are stored, and values of a memory element (not shown) in which the threshold values of the interference detection signal processing circuit 32 are stored, to new parameter values.

Next, a description is given of the motion thereof.

For example, if the clean robot interferes with a wafer cassette and other surrounding substances, an impact received from the substance is finally detected by the acceleration sensor 11 provided in the vicinity of the actuators inside the base. The signals of the acceleration sensor 11 are digitally converted by the A/D converter 30, and the digital filter 31 can pick up signals of only specified frequency bands. Next, as, in the interference detection signal processing circuit 32, the absolute value of the output signal of the digital filter 31 becomes larger than the threshold value stored in the interference detection processing circuit 32, it is judged that interference has occurred, wherein an interference generation signal is generated. As the interference generation signal is outputted, the communication LSI 33 transmits generation of the interference to the robot controller 10. Then, the robot makes an emergency stop upon receiving an instruction from the robot controller 10.

Also, to the contrary, as the robot controller 10 instructs a change in the system parameters such as a filter coefficient and threshold value, the robot controller 10 transmits the type of parameters and the figures thereof to the communication LSI 33.

Such a communication LSI 33 judges the type of the parameters and rewrites the contents of the memory element (not shown) of the digital filter 31 or interference detection signal processing circuit, corresponding to the parameters, to the transmitted values. For example, it is possible to select specified frequency band components of a signal of the acceleration sensor 11 by changing the coefficient of the digital filter 31 to a specified figure.

Therefore, since a communication feature is added to the acceleration sensor, and at the same time the interference detection signal is digitally processed to enable a communication with the robot controller, transmission of the interference generation signal can be carried out by using the communication LSI. In addition, the system parameters of the interference detection means can be carried out by an operator using a teach-box, etc., of the robot controller in compliance with the software incorporated in the robot controller beforehand.

Figure 8:
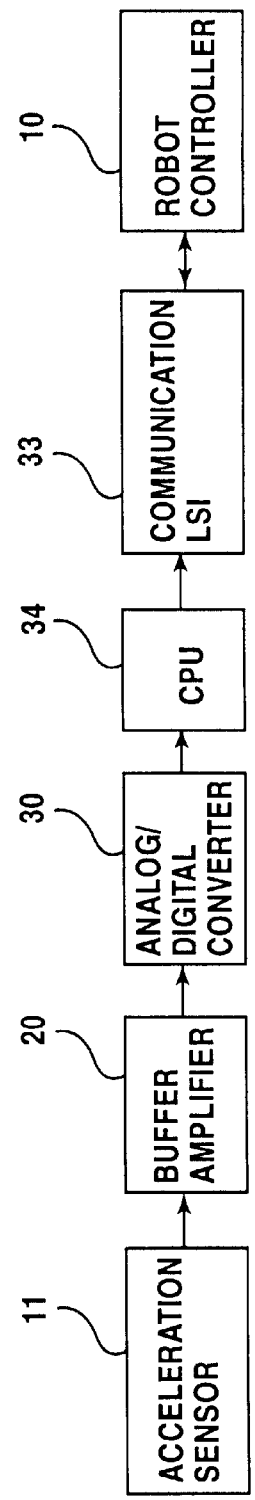
FIG. 8 is a block diagram showing an interference detection means according to still another embodiment of the invention.
Figure 9:
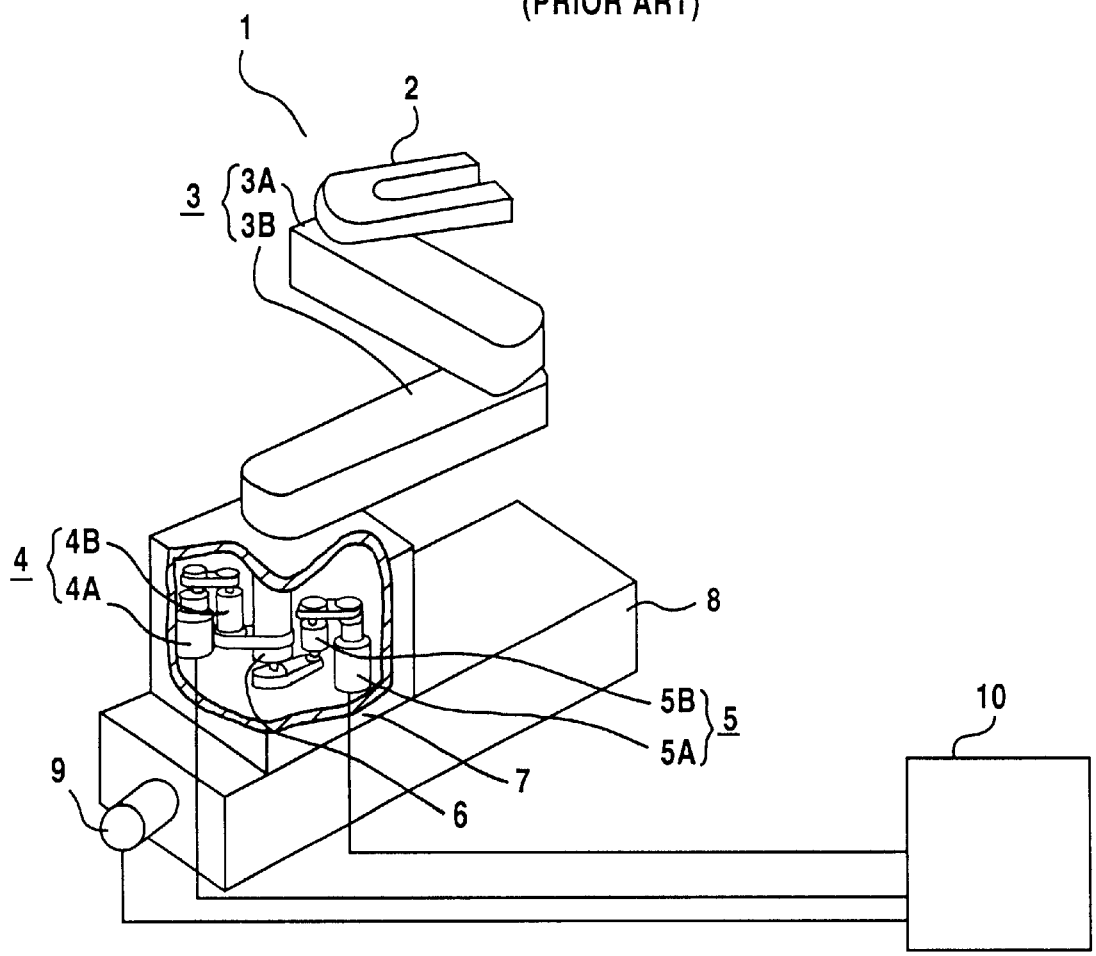
FIG. 9 is a block diagram showing the construction of a prior art clean robot.

In addition, a CPU circuit 34 may be employed, as shown in FIG. 8, to substitute the functions of the abovementioned digital filter circuit 31 and interference detection signal processing circuit 32, in which the functions thereof are processed by software, whereby the order of the filters can be changed by changing the software of the CPU while operating the robot. Also, it is possible to employ a plurality of band-pass filters by only changing the software. In addition, although, in the embodiment, interference is detected by inputting signal, in which a band-pass filter is applied to individual output voltages, into the comparators, it is possible to easily change the detection system in which a square sum of three sensor output voltages are signal-processed, by changing the software of the CPU.

Furthermore, the abovementioned acceleration sensor 11, A/D converter 30, and CPU circuit 34 may be provided in the encoder (not shown) connected to the drive motor, and communication with the robot controller may be substituted by an encoder communication LSI 35 that is newly added. Also, the CPU circuit 34 may be substituted by a CPU circuit for the encoder control. The signal transmission and motion are basically the same as those in the abovementioned embodiment, whereby the power source of the interference detection unit may be obtained from the encoder, and the communication feature for the encoder may be concurrently used as the communication feature added to the acceleration sensor. Therefore, it is possible to save an installation space and save the wiring.

INDUSTRIAL APPLICABILITY

As described above, the protective device for a clean robot according to the invention is effective and available as, for example, a device for protecting the safety of a clean robot used for a transfer apparatus of wafer and liquid crystal substrates, etc., in clean surroundings.

What is claimed is:

1. In a clean robot including robot arms for holding fork for receiving and transferring wafer substance at the tip ends thereof, and turning, extending and contracting in the horizontal direction; a base disposed at the lower part of said robot arm and internally accommodates an actuator consisting of a drive motor for driving said robot arm and a speed reducer coupled to said drive motor; a translational guide provided so that it rectilinearly moves said base in the horizontal direction; and a robot controller for driving and controlling said robot arms and translational guide, a protective device for a clean robot, comprising:

a signal processing circuit that comprises:

acceleration sensors that are disposed inside said base and provided in respective axes so that they detect an impact, which is given by interference of said clean robot with any surrounding substance, as a vibration acceleration in three-axis directions orthogonal to each other;

interference detection means that are provided in contact with the acceleration sensors of the respective axes and outputs a pulse signal when the detection signal of said acceleration sensors exceeds a certain threshold value;

a first AND circuit for converting the signals, which are outputted from the interference detection means of the respective axes, to interference signals;

wherein after the interference signals outputted from said signal processing circuit are transmitted to said robot controller, and the drive motor of said actuator is stopped.

2. The protective device for a clean robot according to claim 1, wherein said interference detection means includes;

a buffer amplifier converting acceleration signals from said acceleration sensor with respect to impedance;

a band-pass filter for discriminating the frequency band of output signals of the vibration acceleration that is impedance-converted by the buffer amplifier;

an amplifier for amplifying the output signals of said band-pass filter;

first and second comparators for comparing the output signals of the vibration acceleration, which are amplified by said amplifier, with the upper limit signal and lower limit signal of the vibration acceleration, which become said threshold values; and a second AND circuit for converting the signals compared by said two comparators to signals, which output interference when the signals exceed any one of the threshold values.

3. The protective device for a clean robot according to claim 1 or 2, wherein a latch circuit, which holds a pulse signal from said interference detection means for longer than the sampling time of said robot controller, between said first AND circuit and said robot controller, and all the interference detecting signals are detected by said robot controller.

* * * * *